(12) United States Patent
Ota

(10) Patent No.: US 12,135,336 B2
(45) Date of Patent: Nov. 5, 2024

(54) CONTACT, INSPECTION JIG, INSPECTION DEVICE, AND METHOD OF MANUFACTURING CONTACT

(71) Applicant: NIDEC READ CORPORATION, Kyoto (JP)

(72) Inventor: Norihiro Ota, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 0 days.

(21) Appl. No.: 17/791,223

(22) PCT Filed: Dec. 22, 2020

(86) PCT No.: PCT/JP2020/047820
§ 371 (c)(1),
(2) Date: Jul. 7, 2022

(87) PCT Pub. No.: WO2021/140904
PCT Pub. Date: Jul. 15, 2021

(65) Prior Publication Data
US 2023/0349950 A1 Nov. 2, 2023

(30) Foreign Application Priority Data

Jan. 10, 2020 (JP) ................................ 2020-002840

(51) Int. Cl.
*G01R 1/067* (2006.01)
*G01R 3/00* (2006.01)

(52) U.S. Cl.
CPC ..... *G01R 1/06738* (2013.01); *G01R 1/06722* (2013.01); *G01R 3/00* (2013.01)

(58) Field of Classification Search
CPC .. G01R 1/06738; G01R 1/06722; G01R 3/00; G01R 1/0491; G01R 1/06733; G01R 1/0675; G01R 1/06761
See application file for complete search history.

(56) References Cited

U.S. PATENT DOCUMENTS 5,062,619 A * 11/1991 Sato .......................... F16F 1/02
267/273
8,547,128 B1 10/2013 Sochor
(Continued)

FOREIGN PATENT DOCUMENTS

JP H08159195 A 6/1996
JP H11270604 A 10/1999
(Continued)

*Primary Examiner* — G. M. A Hyder
(74) *Attorney, Agent, or Firm* — VIERING, JENTSCHURA & PARTNER MBB

(57) ABSTRACT

A contact, an inspection jig using the contact, an inspection device, and a method of manufacturing the contact are provided. A contact includes a coil spring including a slit formed in a cylindrical body and first and second conductors. A bottom wall portion, a first side wall portion, a second side wall portion, and a top wall portion are configured so a cross-sectional shape of the cylindrical body as viewed in the axial direction is rectangular, the slit includes a first slit, a second slit, a third slit, and a fourth slit, the third slit is continuous with the first slit and the second slit, the fourth slit is continuous with the second slit, the first slit and the second slit are rectangular in a side view of the cylindrical body, the first and second conductors respectively connected to first and second end portions of the cylindrical body.

19 Claims, 12 Drawing Sheets

(56) References Cited

U.S. PATENT DOCUMENTS

| | | | |
|---|---|---|---|
| 2016/0118738 A1 | 4/2016 | Nasu et al. | |
| 2018/0340957 A1 | 11/2018 | Teranishi et al. | |
| 2019/0011479 A1 | 1/2019 | Ota | |
| 2019/0346485 A1 | 11/2019 | Ota | |
| 2020/0174038 A1 | 6/2020 | Nasu et al. | |
| 2021/0278439 A1 | 9/2021 | Kádár et al. | |
| 2022/0026481 A1* | 1/2022 | Ota | G01R 31/2607 |

FOREIGN PATENT DOCUMENTS

| | | | | |
|---|---|---|---|---|
| JP | 2003339139 A | | 11/2003 | |
| JP | 2004011870 A | | 1/2004 | |
| JP | 2005268090 A | | 9/2005 | |
| JP | 2007024664 A | | 2/2007 | |
| JP | 2011033410 A | | 2/2011 | |
| JP | 2012057995 A | | 3/2012 | |
| JP | 2013120065 A | | 6/2013 | |
| JP | 2013196924 A | | 9/2013 | |
| KR | 20120044336 A | | 5/2012 | |
| KR | 20150053480 A | | 5/2015 | |
| WO | 2011013731 A1 | | 2/2011 | |
| WO | 2017141564 A1 | | 8/2017 | |
| WO | 2018070154 A1 | | 4/2018 | |
| WO | WO-2020112474 A1 * | | 6/2020 | F16F 1/028 |

\* cited by examiner

CONTACT, INSPECTION JIG, INSPECTION DEVICE, AND METHOD OF MANUFACTURING CONTACT

CROSS-REFERENCE TO RELATED APPLICATIONS

This is a U.S. National Stage Application, filed under 35 U.S.C. § 371, of International Application No. PCT/JP2020/047820, filed on Dec. 22, 2020, and claims priority under 35 U.S.C. § 119(a) and 35 U.S.C. § 365(b) from Japanese Patent Application No. 2020-002840, filed on Jan. 10, 2020; the disclosures of which are incorporated herein by reference.

FIELD

Various embodiments of the present disclosure relate to a contact used to inspect an inspection target, an inspection jig to bring the contact into contact with an inspection target, an inspection device including the inspection jig, and a method of manufacturing the contact.

BACKGROUND

Conventionally, there has been known a coil spring probe that includes a contact pin having a contact that comes into contact with a conductive pad of a measurement object and a cylindrical tubular body into which a columnar guide extending on a straight line of the contact of the contact pin is inserted, and a part of a peripheral wall of the tubular body is a spring.

In recent years, miniaturization of a semiconductor substrate and a circuit substrate of a measurement object has been progressing. An inspection point of a measurement object and an adjacent pitch between inspection points are also reduced. For this reason, a diameter of a probe used for inspection is about 0.1 mm.

However, when an attempt is made to set the diameter to 0.1 mm for the above-described coil spring probe, it is necessary to manually insert a thinner columnar guide into a tubular body having a diameter of 0.1 mm, which takes time and effort.

SUMMARY

An exemplary contact according to an example of the present disclosure includes a coil spring in which a slit is formed in a cylindrical body, a first conductor having a substantially rod-like shape, and a second conductor having a substantially rod-like shape. The cylindrical body includes a bottom wall portion, a first side wall portion and a second side wall portion connected to the bottom wall portion, and a top wall portion facing the bottom wall portion, the bottom wall portion, the first side wall portion, the second side wall portion, and the top wall portion are configured such that a cross-sectional shape of the cylindrical body as viewed in an axial direction is rectangular, the slit includes a first slit provided in the first side wall portion, a second slit provided in the second side wall portion, a third slit provided in the top wall portion, and a fourth slit provided in the bottom wall portion, the third slit is continuous with the first slit and the second slit, the fourth slit is continuous with the second slit, the first slit and the second slit have a rectangular shape in a side view of the cylindrical body, the first conductor is connected to a first end portion of the cylindrical body, and the second conductor is connected to a second end portion of the cylindrical body.

Further, an exemplary inspection jig according to an example of the present disclosure includes the contact described above and a support member that supports the contact.

Further, an exemplary inspection device according to an example of the present disclosure includes the inspection jig described above and an inspection processing unit that performs an inspection of an inspection target on the basis of an electric signal obtained as the contact is brought into contact with an inspection point provided on the inspection target.

An exemplary method of manufacturing a contact according to an example of the present disclosure is a method of manufacturing the contact described above, in which the first side wall portion and the second side wall portion are formed after the bottom wall portion is formed.

The above and other elements, features, steps, characteristics and advantages of the present disclosure will become more apparent from the following detailed description of the various embodiments with reference to the attached drawings.

DETAILED DESCRIPTION

Figure 1:
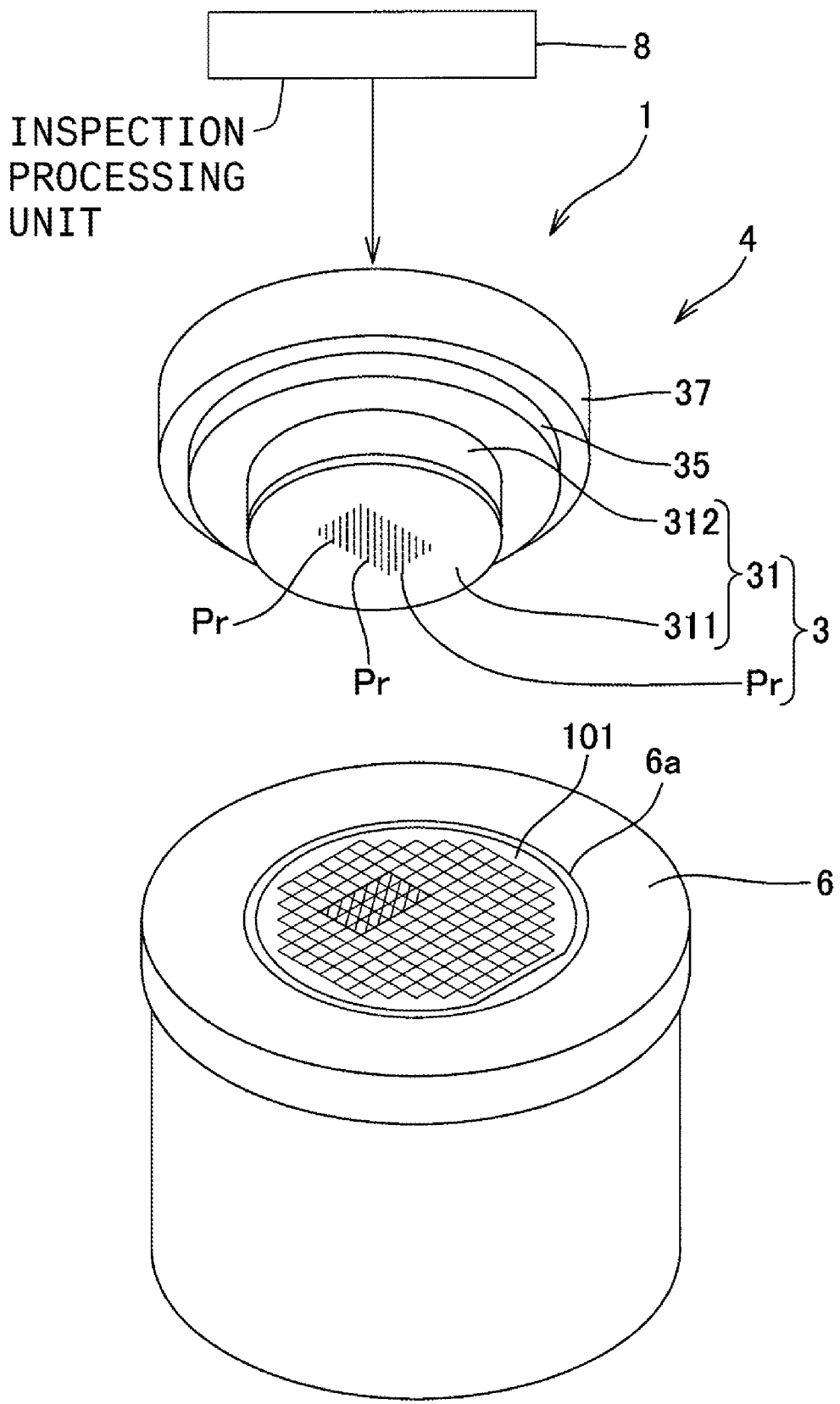
FIG. 1 is a conceptual diagram schematically illustrating a configuration of an inspection device 1 provided with a contact Pr according to an exemplary embodiment of the present disclosure.

Hereinafter, an embodiment of the present disclosure will be described with reference to the accompanying drawings.

Note that configurations with the same reference numerals in the drawings are the same configurations and description of such configurations will be omitted.

An inspection device 1 illustrated in FIG. 1 is a semiconductor inspection device for inspecting a circuit that is formed on a semiconductor wafer 101 that is an example of an inspection object.

In the semiconductor wafer 101, circuits corresponding to a plurality of semiconductor chips are formed, for example, on a semiconductor substrate of silicon or the like. Note that the inspection object may be an electronic component such as a semiconductor chip, a chip size package (CSP), or a semiconductor element (integrated circuit (IC)), or another target for electrical inspection.

Further, the inspection device is not limited to a semiconductor inspection device and may be a substrate inspection device that inspects a substrate, for example. A substrate that is an inspection object may be, for example, a substrate such as a print wiring substrate, a glass epoxy substrate, a flexible substrate, a ceramic multilayered wiring substrate, a package substrate for a semiconductor package, an interposer substrate, or a film carrier, an electrode panel for a display such as a liquid crystal display, an electro-luminescence (EL) display, or a touch panel display, an electrode panel for a touch panel or the like, or substrates of various kinds.

The inspection device 1 illustrated in FIG. 1 includes an inspection unit 4, a sample stage 6, and an inspection processing unit 8. A placement portion 6a on which the semiconductor wafer 101 is placed is provided on an upper surface of the sample stage 6, and the sample stage 6 is configured to fix the semiconductor wafer 101 that is an inspection target at a predetermined position.

The placement portion 6a is configured to be able to be lifted and lowered and is configured such that the semiconductor wafer 101 accommodated in the sample stage 6 is caused to be lifted to an inspection position and the semiconductor wafer 101 after inspection is stored in the sample stage 6, for example. Further, the placement portion 6a is configured to be able to cause the semiconductor wafer 101 to rotate and orient an orientation flat to a predetermined direction, for example. Further, the inspection device 1 includes a transport mechanism such as a robot arm (not illustrated). By the transport mechanism, the semiconductor wafer 101 is placed on the placement portion 6a, and the semiconductor wafer 101 after inspection is transported from the placement portion 6a.

The inspection unit 4 includes an inspection jig 3, a pitch conversion block 35, and a connection plate 37. The inspection jig 3 is a jig for performing inspection by bringing a plurality of contacts Pr into contact with the semiconductor wafer 101, and is configured as, for example, what is called a probe card.

A plurality of chips are formed on the semiconductor wafer 101. A plurality of pads and inspection points such as a bump BP are formed in each of the chips. Corresponding to a partial region of a plurality of the chips formed in the semiconductor wafer 101 (for example, a hatched region in FIG. 1; hereinafter, referred to as an inspection region), the inspection jig 3 holds a plurality of the contacts Pr such that the contacts Pr correspond to inspection points in the inspection region.

If the contact Pr is brought into contact with each of the inspection points in the inspection region and inspection in the inspection region is finished, the placement portion 6a lowers the semiconductor wafer 101, the sample stage 6 moves in parallel and causes the inspection region to move, and the placement portion 6a causes the semiconductor wafer 101 to be lifted and brings the contact Pr into contact with a new inspection region so that inspection is performed. In this manner, the entire semiconductor wafer 101 is inspected as inspection is performed while the inspection region is caused to sequentially move.

Note that, FIG. 1 is an explanatory diagram simply and conceptually illustrating an example of the configuration of the inspection device 1 from the viewpoint of allowing easy understanding of the present disclosure, and the number, the density, and the arrangement of the contacts Pr, the shapes of and the size ratios between portions of the inspection unit 4 and the sample stage 6, and the like are also illustrated in a simple and conceptual manner. For example, the inspection region is illustrated in an enlarged and emphasized manner as compared with a typical semiconductor inspection device in terms of easy understanding of the arrangement of the contacts Pr, and the inspection region may be smaller or larger.

The connection plate 37 is configured such that the pitch conversion block 35 can be detached and attached. A plurality of electrodes (not illustrated) that are connected to the pitch conversion block 35 are formed on the connection plate 37. The electrodes of the connection plate 37 are electrically connected to the inspection processing unit 8 with a cable, a connection terminal, or the like (not illustrated), for example. The pitch conversion block 35 is a pitch conversion member for converting an interval between the contacts Pr into an electrode pitch of the connection plate 37.

The inspection jig 3 includes a plurality of the contacts Pr having a distal end portion T and a proximal end portion B to be described later, and a support member 31 that holds a plurality of the contacts Pr with the distal end portion T facing the semiconductor wafer 101.

An electrode 34a described later, which is brought into contact with and electrically conductive to the proximal end portion B of each of the contacts Pr, is provided on the pitch conversion block 35. The inspection unit 4 includes a connection circuit (not illustrated) that electrically connects each of the contacts Pr of the inspection jig 3 to the inspection processing unit 8 and switches the connection via the connection plate 37 and the pitch conversion block 35.

In this manner, the inspection processing unit 8 is configured to be able to supply an inspection signal to an optional one of the contacts Pr and detects a signal from an optional one of the contacts Pr via the connection plate 37 and the pitch conversion block 35.

The inspection processing unit 8 includes, for example, a power supply circuit, a voltmeter, an ammeter, a microcomputer, and the like. The inspection processing unit 8 controls a driving mechanism (not illustrated) to move and position the inspection unit 4, and brings each of the contacts Pr into contact with each inspection point on the semiconductor wafer 101. In this manner, the inspection points and the inspection processing unit 8 are electrically connected.

The inspection processing unit 8 supplies current or voltage for inspection to each inspection point on the semiconductor wafer 101 through each of the contacts Pr of the inspection jig 3 in the above-described state, and executes inspection of the semiconductor wafer 101 for, for example, a disconnection in a circuit pattern, a short circuit, or the like on the basis of an electric signal of voltage, current, or the like obtained from each of the contacts Pr. Alternatively, the inspection processing unit 8 may supply AC current or voltage to each inspection point, so as to measure an impedance of the inspection target on the basis of an electric signal of voltage, current, or the like obtained from each of the contacts Pr.

Figure 2:
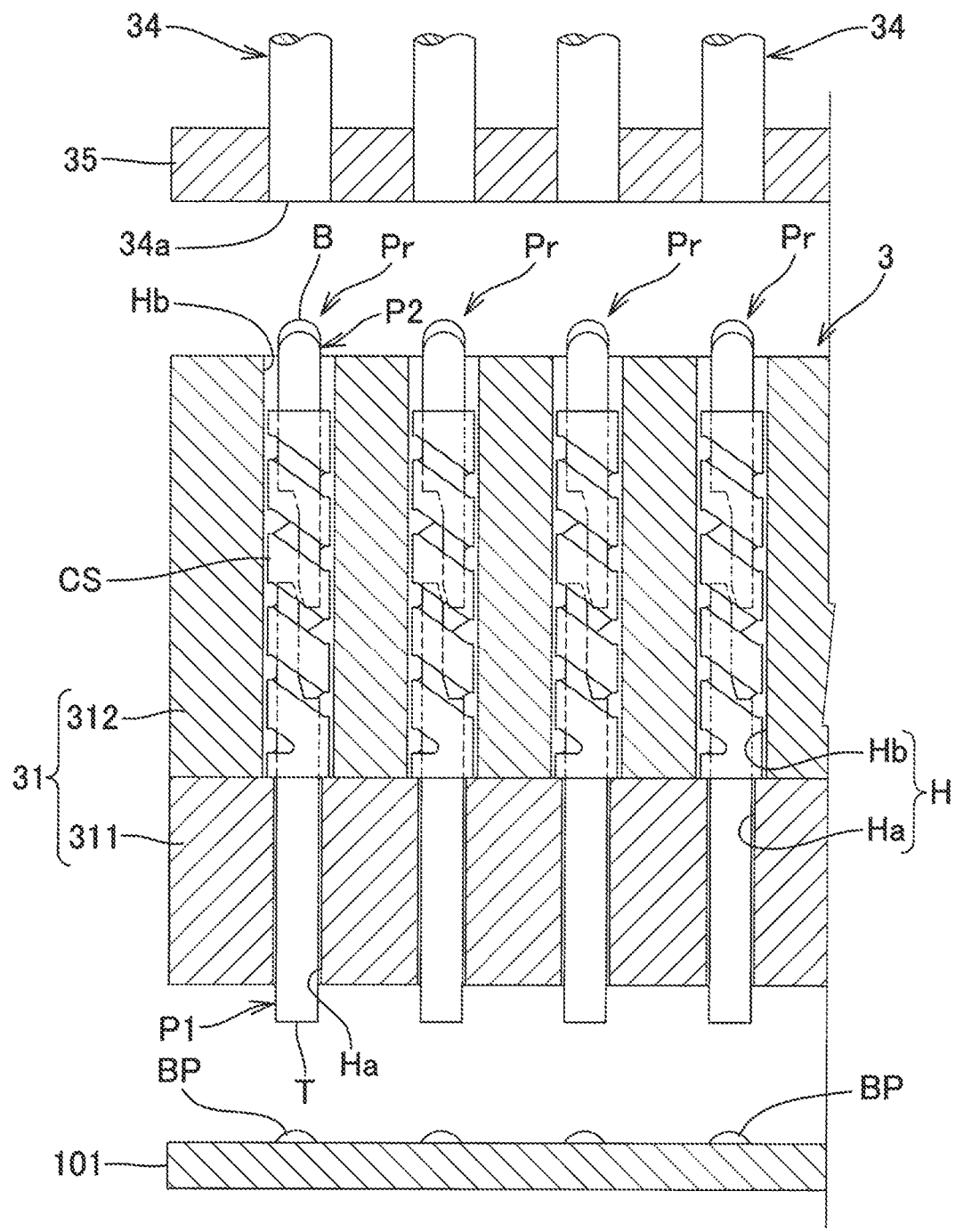
FIG. 2 is a schematic cross-sectional view illustrating an example of a configuration of an inspection jig 3 illustrated in FIG. 1 in a simplified manner.

The support member 31 illustrated in FIG. 2 is configured by, for example, plate-shaped support plates 311 and 312 placed one upon another. A plurality of through holes H penetrating the support plates 311 and 312 are formed. The through hole H is a rectangular hole having a substantially square cross-sectional shape perpendicular to the axial direction. The contact Pr is inserted into each of the through holes H.

A plurality of insertion holes Hb each of which is an opening hole having a predetermined diameter is formed in the support plate 312. A support hole Ha having a smaller diameter than the insertion hole Hb is formed in the support plate 311. The through hole H is formed by communication between the insertion hole Hb of the support plate 312 and the support hole Ha of the support plate 311.

Note that the support plate 312 may be configured by stacking a plurality of support plates. Further, instead of the support plate 312, a plurality of support plates may be connected to each other by, for example, a support column or the like in a state of being separated from each other. Further, the support member 31 may not necessarily be limited to the configuration where the plate-shaped support plates 311 and 312 are stacked, but may be configured as, for example, a single member provided with the through hole H.

Figure 11:
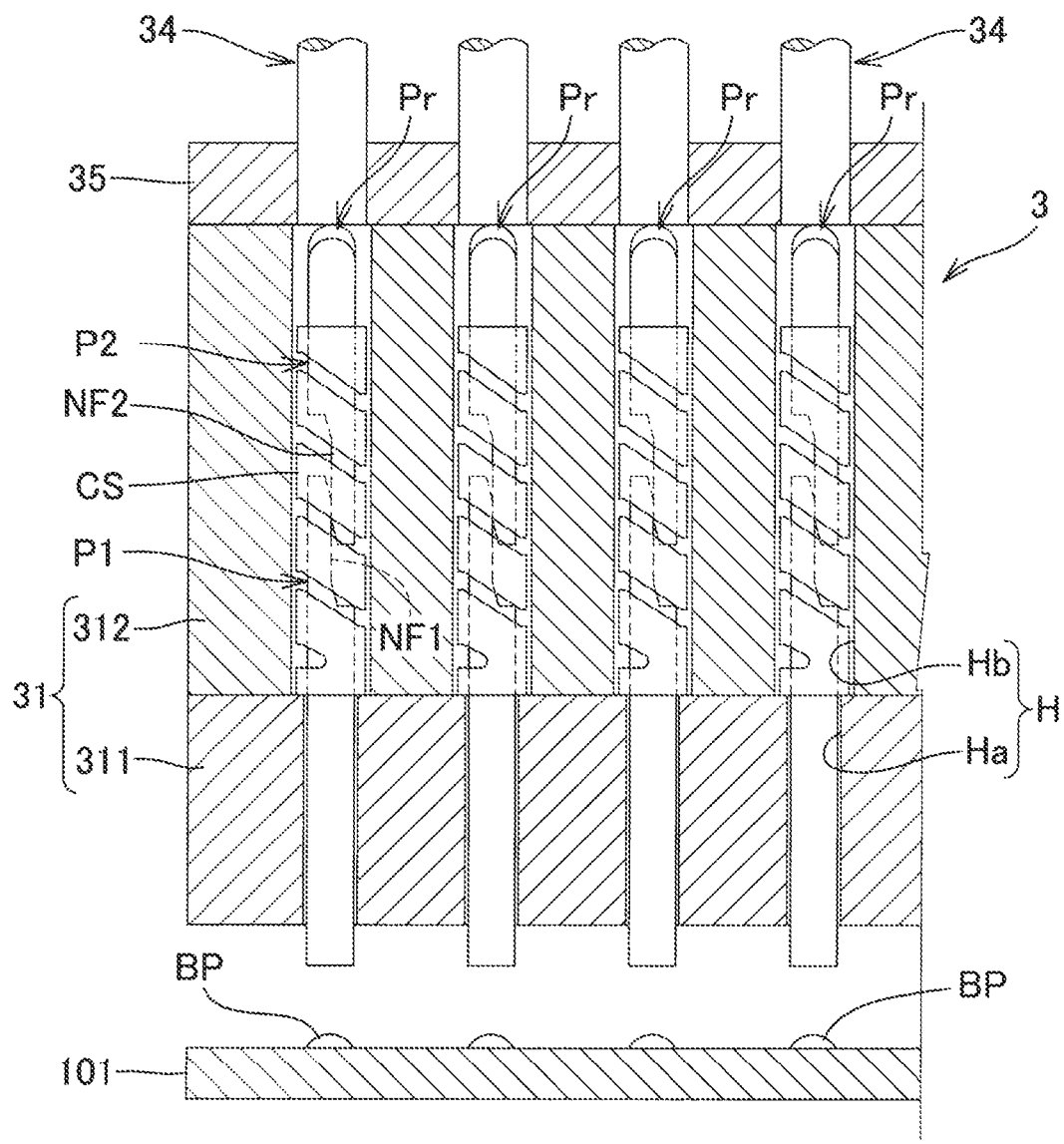
FIG. 11 is a schematic cross-sectional view illustrating a state in which the inspection jig 3 illustrated in FIG. 2 is attached to a pitch conversion block 35.

The pitch conversion block 35 made from, for example, an insulating resin material is attached to one end portion side of the support plate 312, and an opening portion on one end portion side of the through hole H is blocked by the pitch conversion block 35 (see FIG. 11). A wiring 34 is attached to the pitch conversion block 35 so as to penetrate the pitch conversion block 35 at a position facing the opening portion of the through hole H.

A surface of the pitch conversion block 35 facing the support plate 312 is set to be flush with an end surface of the wiring 34. The end surface of the wiring 34 forms the electrode 34a. Each of the wirings 34 is connected to each electrode of the connection plate 37 while increasing a pitch. The pitch conversion block 35 may be configured using a multilayered wiring substrate such as a multi layer organic (MLO) or a multi layer ceramic (MLC) instead of the wiring 34.

Figure 3:
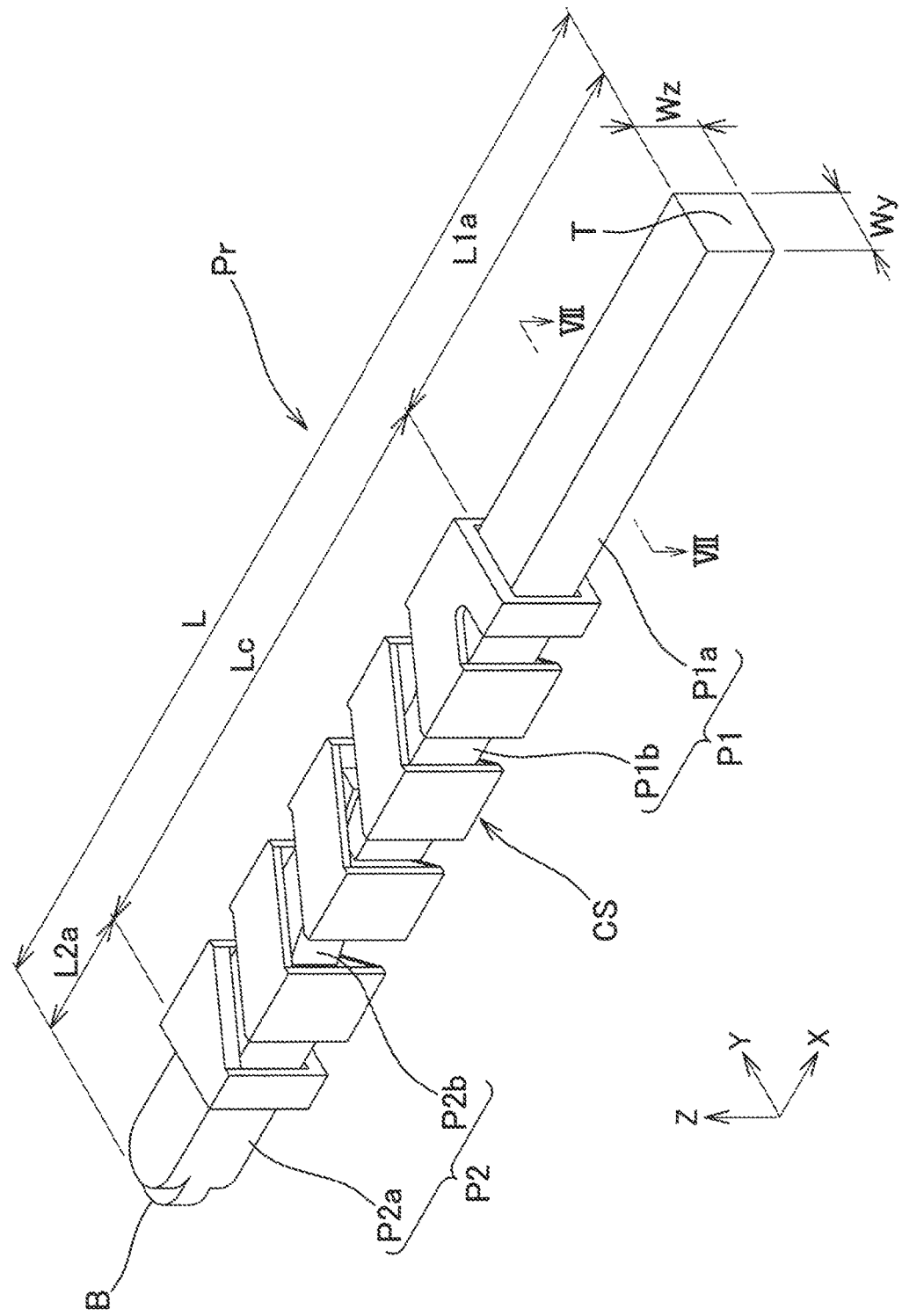
FIG. 3 is a perspective view illustrating an example of a configuration of the contact Pr illustrated in FIG. 2.

Referring to FIG. 3, the contact Pr includes a coil spring CS, a first conductor P1, and a second conductor P2. In each drawing, XYZ orthogonal coordinate axes are appropriately shown in order to clarify a directional relationship. In each drawing, an axial direction of the contact Pr (the coil spring CS, the first conductor P1, and the second conductor P2) in the horizontal direction is defined as an X direction, a direction perpendicular and horizontal to the X direction is defined as a Y direction, and a direction perpendicular to the X and Y directions is defined as a Z direction.

The coil spring CS, the first conductor P1, and the second conductor P2 are made from a conductive material such as Ni, NiCo, a nickel alloy, or Pd. Further, as described later, a material having higher conductivity than Ni or the like described above, for example, copper or the like is embedded in the first conductor P1 and the second conductor P2.

Figure 4:
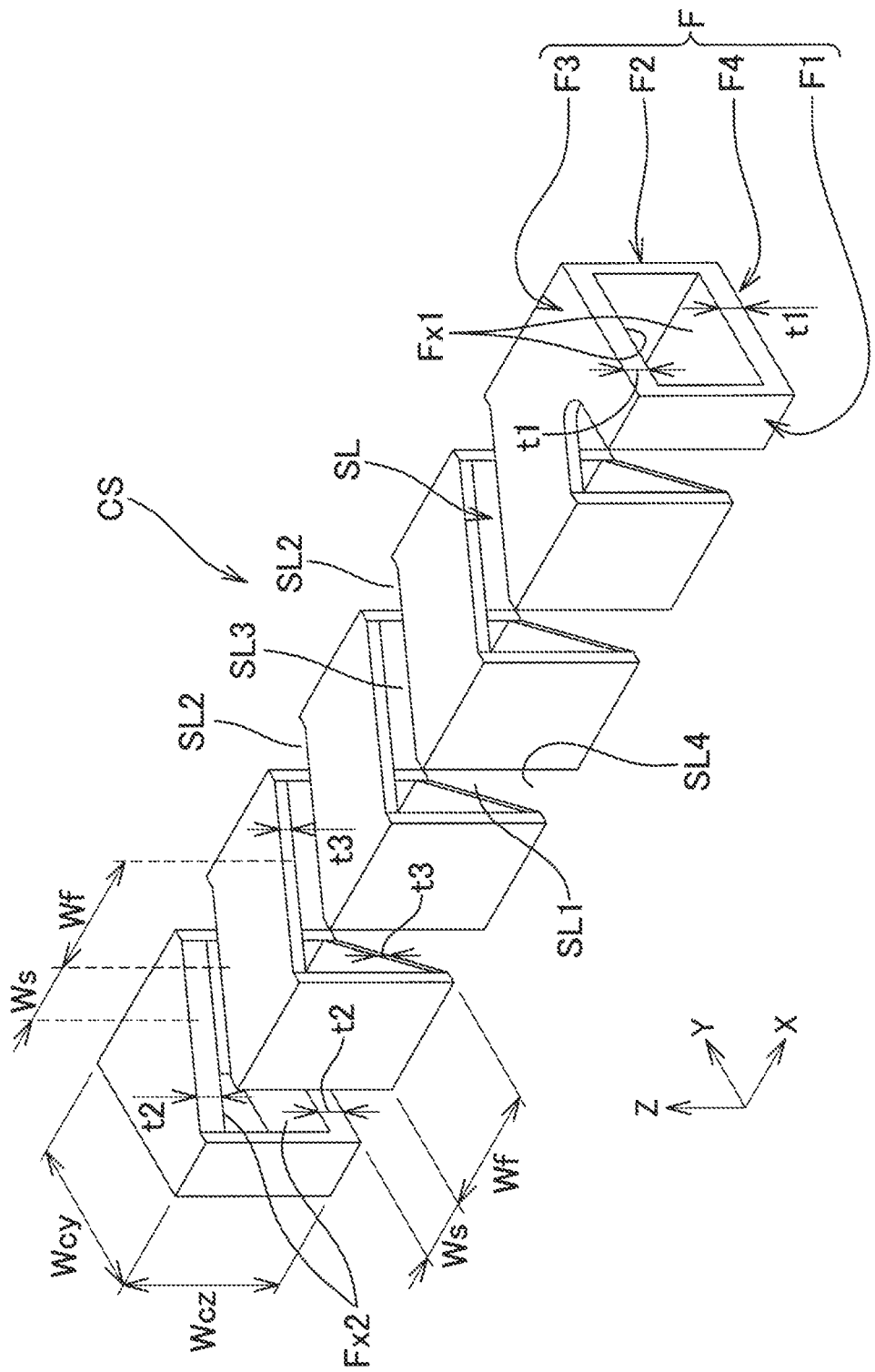
FIG. 4 is a perspective view illustrating an example of a configuration of a coil spring CS illustrated in FIG. 3.

Referring to FIG. 4, the coil spring CS illustrated in FIG. 3 is formed into a coil shape by a slit SL extending spirally along a peripheral wall of a cylindrical body F having a cylindrical shape whose cross-sectional shape perpendicular to the axial direction is rectangular.

The slit SL is formed by communication between a first slit SL1, a third slit SL3, a second slit SL2, and a fourth slit SL4.

A peripheral wall of the cylindrical body F includes a first side wall portion F1 and a second side wall portion F2 facing each other, and a top wall portion F3 and a bottom wall portion F4 bridged between the first side wall portion F1 and the second side wall portion F2. That is, the first side wall portion F1 and the second side wall portion F2 are connected to the bottom wall portion F4. In this manner, the bottom wall portion F4, the first side wall portion F1, the second side wall portion F2, and the top wall portion F3 are configured such that a cross-sectional shape of the cylindrical body F as viewed in the axial direction is rectangular.

The first side wall portion F1, the second side wall portion F2, the top wall portion F3, and the bottom wall portion F4 have substantially flat shapes. The first side wall portion F1 and the second side wall portion F2 extend along an XZ plane. The top wall portion F3 and the bottom wall portion F4 extend along an XY plane.

The first slit SL1 is formed in the first side wall portion F1 and extends perpendicular to the axial direction. The second slit SL2 is formed in the second side wall portion F2 and extends perpendicular to the axial direction. That is, the first slit SL1 and the second slit SL2 extend along the Z direction. In a side view of the cylindrical body F, the first slit SL1 and the second slit SL2 have a rectangular shape.

The third slit SL3 is formed in the top wall portion F3 and extends inclined with respect to the axial direction. The third slit SL3 allows the first slit SL1 and the second slit SL2 to communicate with each other.

The fourth slit SL4 is formed in the bottom wall portion F4 and extends inclined with respect to the axial direction. The fourth slit SL4 allows the second slit SL2 and the first slit SL1 to communicate with each other. The third slit SL3 and the fourth slit SL4 are orthogonal to the Z direction and are inclined with respect to the X direction and the Y direction.

First end portions of the top wall portion F3 and the bottom wall portion F4 are provided with a fixing portion Fx1 fixed to a first portion P1b. A fixing portion Fx2 fixed to a second portion P2b is provided in second end portion of the top wall portion F3 and the bottom wall portion F4. A thickness t1 of the fixing portion Fx1 and a thickness t2 of the fixing portion Fx2 are larger than a thickness t3 of the top wall portion F3 and the bottom wall portion F4 in the vicinity of a central portion of the coil spring CS.

Figure 5:
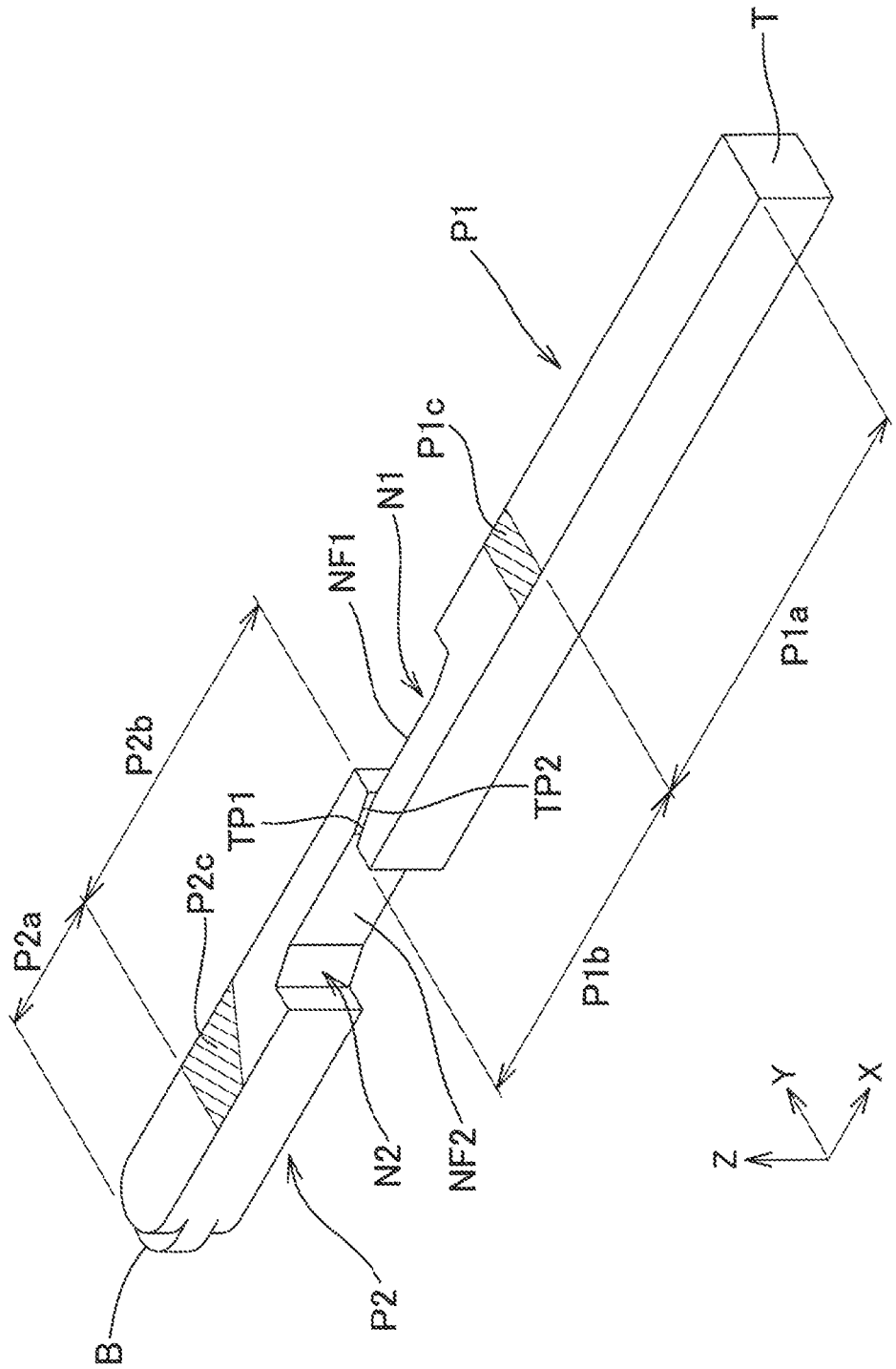
FIG. 5 is a perspective view illustrating an example of a configuration of a first conductor P1 and a second conductor P2 illustrated in FIG. 3.

Referring to FIG. 5, the first conductor P1 and the second conductor P2 have a substantially rod-like shape. A distal end of the first conductor P1 is the distal end portion T of the contact Pr. A distal end of the second conductor P2 is the proximal end portion B of the contact Pr.

The first conductor P1 is configured in a manner that the first portion P1b located inside a first end portion side of the coil spring CS is connected to a first protruding portion P1a protruding from the first end portion of the coil spring CS. A fixing region P1c is provided in the vicinity of a boundary with the first protruding portion P1a in the first portion P1b.

The fixing region P1c is fixed to the fixing portion Fx1 in the first end portion of the coil spring CS illustrated in FIG. 4. In this manner, a portion other than the fixing region P1c in the first portion P1b is configured inside the coil spring CS in a state of being spaced apart from the top wall portion F3 and the bottom wall portion F4 by a distance corresponding to a difference between the thickness t1 and the thickness t3. As will be described later, the coil spring CS and the first conductor P1 are integrally formed. In this manner, the coil spring CS and the first conductor P1 are connected in an integrally continuous state in the fixing portion Fx1 and the fixing region P1c.

In a distal end portion of the first portion P1b, a first notch portion N1 having a shape in which a first side edge portion of the first portion P1b is notched is provided. The first notch portion N1 has a substantially flat first contact surface NF1 extending along the axial direction. A first tapered portion TP1 is formed continuously with the first contact surface NF1 in a distal end portion of the first notch portion N1. The first tapered portion TP1 is configured to have thickness decreased toward a distal end of the first portion P1b.

The first notch portion N1 is recessed in the Y direction. The first contact surface NF1 extends along the XZ plane. The first tapered portion TP1 extends in the Z direction and is inclined in a direction in which the distal end is separated from the second conductor P2 with respect to the X and Y directions.

The second conductor P2 is configured in a manner that the second portion P2b located in the inside on a second end portion side of the coil spring CS and a second protruding portion P2a protruding from the second end portion of the coil spring CS. A fixing region P2c is provided in the vicinity of a boundary with the second protruding portion P2a in the second portion P2b.

The fixing region P2c is fixed to the fixing portion Fx2 in the second end portion of the coil spring CS illustrated in FIG. 4. In this manner, a portion other than the fixing region P2c in the second portion P2b is inserted into the coil spring CS in a state of being spaced apart from the top wall portion F3 and the bottom wall portion F4 by a distance corresponding to a difference between the thickness t2 and the thickness t3. As will be described later, the coil spring CS and the second conductor P2 are integrally formed. In this manner, the coil spring CS and the second conductor P2 are connected in an integrally continuous state in the fixing portion Fx2 and the fixing region P2c.

In a distal end portion of the second portion P2b, a second notch portion N2 having a shape in which a first side edge portion of the second portion P2b is notched is provided. The second notch portion N2 has a substantially flat second contact surface NF2 extending along the axial direction. A second tapered portion TP2 is formed continuously with the second contact surface NF2 in a distal end portion of the second notch portion N2. The second tapered portion TP2 is configured to have thickness decreased toward a distal end of the second portion P2b.

The second notch portion N2 is recessed in the Y direction, the opposite direction to the first notch portion N1. The second contact surface NF2 extends along the XZ plane. The second tapered portion TP2 extends in the Z direction and is inclined in a direction in which the distal end is separated from the first conductor P1 with respect to the X and Y directions.

In a distal end portion of the second protruding portion P2a, that is, the proximal end portion B of the contact Pr, a central portion in the Z direction protrudes further than both side portions in the Z direction. The distal end portion T and the proximal end portion B of the contact Pr may be flat, and may have various shapes suitable for contact with the inspection point and the electrode 34a, such as a crown shape and a conical shape.

A portion of the first conductor P1 other than the first notch portion N1 and a portion of the second conductor P2 other than the second notch portion N2 have a rectangular cross-sectional shape perpendicular to the axial direction. A length of one side of the cross-sectional shape is slightly shorter than a length of one side of an inner wall in a cross-sectional shape perpendicular to the axial direction of the coil spring CS. As described above, by making the cross-sectional shape rectangular, cross-sectional areas of the first conductor P1 and the second conductor P2 can be increased as compared with a contact having a circular cross section, and electrical resistance of the first conductor P1 and the second conductor P2 can be reduced.

FIG. 5 illustrates relative positions of the first conductor P1 and the second conductor P2 in a state where no load is applied to the coil spring CS and the coil spring CS is not compressed. When no load is applied to the coil spring CS, the first contact surface NF1 and the second contact surface NF2 are separated from each other, and the first tapered portion TP1 and the second tapered portion TP2 are arranged to face each other while being separated from each other. The first contact surface NF1 and the second contact surface NF2 are located in the same plane.

Figure 6:
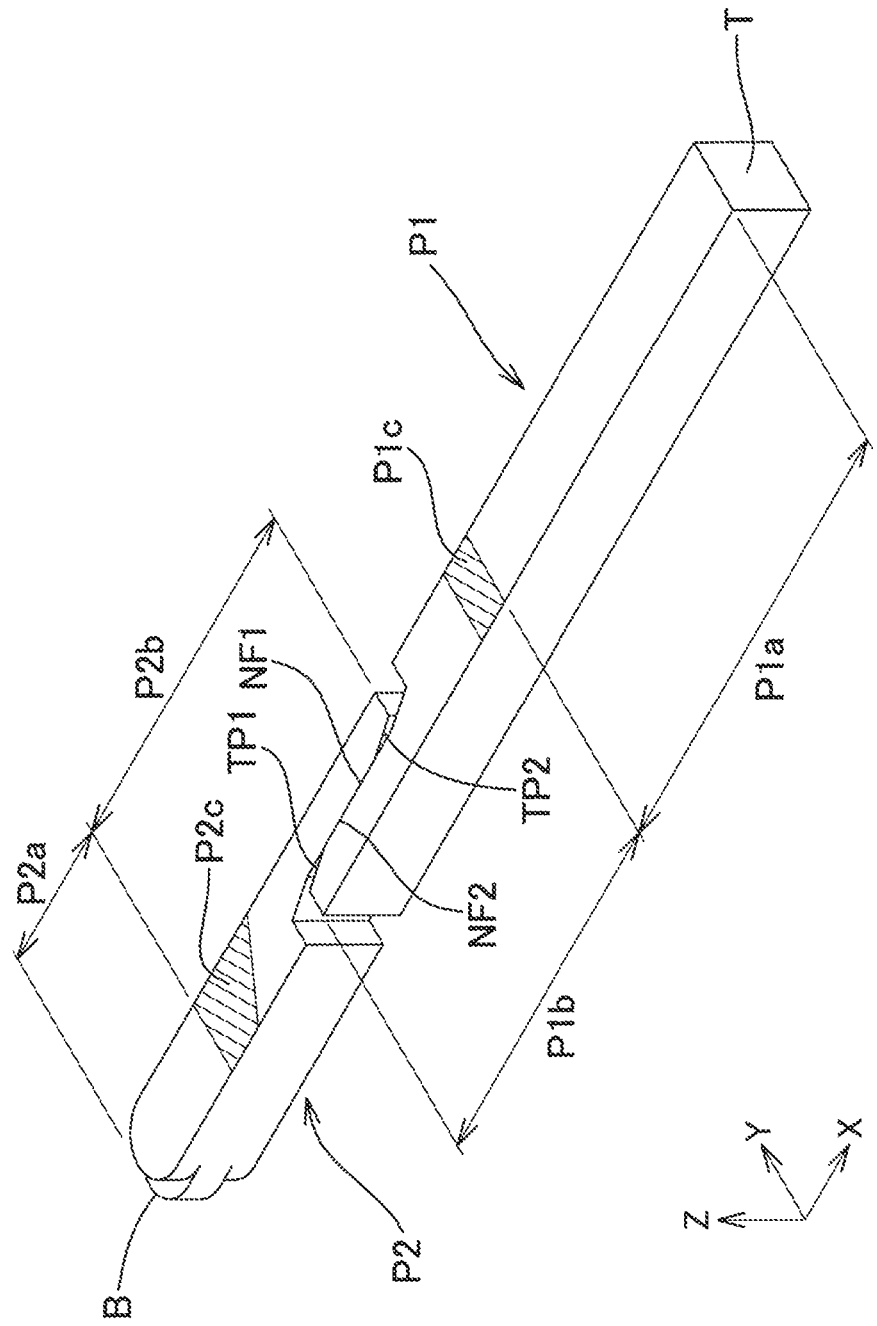
FIG. 6 is an explanatory diagram illustrating relative positions of the first conductor P1 and the second conductor P2 in a state where a load is applied to the coil spring CS and the coil spring CS is compressed.

Referring to FIG. 3, when a load is applied between the distal end portion T and the proximal end portion B, the coil spring CS is compressed. Since the first conductor P1 and the second conductor P2 are fixed to the coil spring CS in the fixing regions P1c and P2c, when the coil spring CS is compressed, the first conductor P1 and the second conductor P2 relatively move in the approaching direction as illustrated in FIG. 6.

At this time, since the first contact surface NF1 and the second contact surface NF2 are located in the same plane, the first contact surface NF1 and the second contact surface NF2 slide. In this manner, when a predetermined load is applied to the coil spring CS, the first contact surface NF1 and the second contact surface NF2 come into contact with each other.

Further, when no load is applied to the coil spring CS, the first tapered portion TP1 and the second tapered portion TP2 are arranged to face each other while being separated from each other. Therefore, when the coil spring CS is compressed from this state, the first tapered portion TP1 and the second tapered portion TP2 guide relative positions of the first contact surface NF1 and the second contact surface NF2 to a slidable position.

In this manner, sliding between the first contact surface NF1 and the second contact surface NF2 becomes smooth, and the first contact surface NF1 and the second contact surface NF2 stably come into contact with each other. As a result, reliability of electrical conduction from the distal end portion T to the proximal end portion B is improved.

Referring to FIG. 3, in a state where no load is applied, an entire length L of the contact Pr is, for example, about 1.15 mm, and a length Lc of the coil spring CS is, for example, about 0.6 mm. A length L1a of the first protruding portion P1a is, for example, about 0.4 mm, and a length L2a of the second protruding portion P2a is, for example, about 0.15 mm. A width Wy in the Y direction of the first conductor P1 and the second conductor P2 is, for example, about 0.068 mm, and a width Wz in the Z direction is, for example, about 0.068 mm.

Referring to FIG. 4, a width Wcy of the coil spring CS in the Y direction is, for example, about 0.1 mm, and a width Wcz in the Z direction is, for example, about 0.1 mm. A line width Wf of the coil spring CS along the X direction is, for example, about 0.08 mm. A width Ws of the slit SL in the X direction is, for example, about 0.04 mm in a state where no load is applied.

Figure 7:
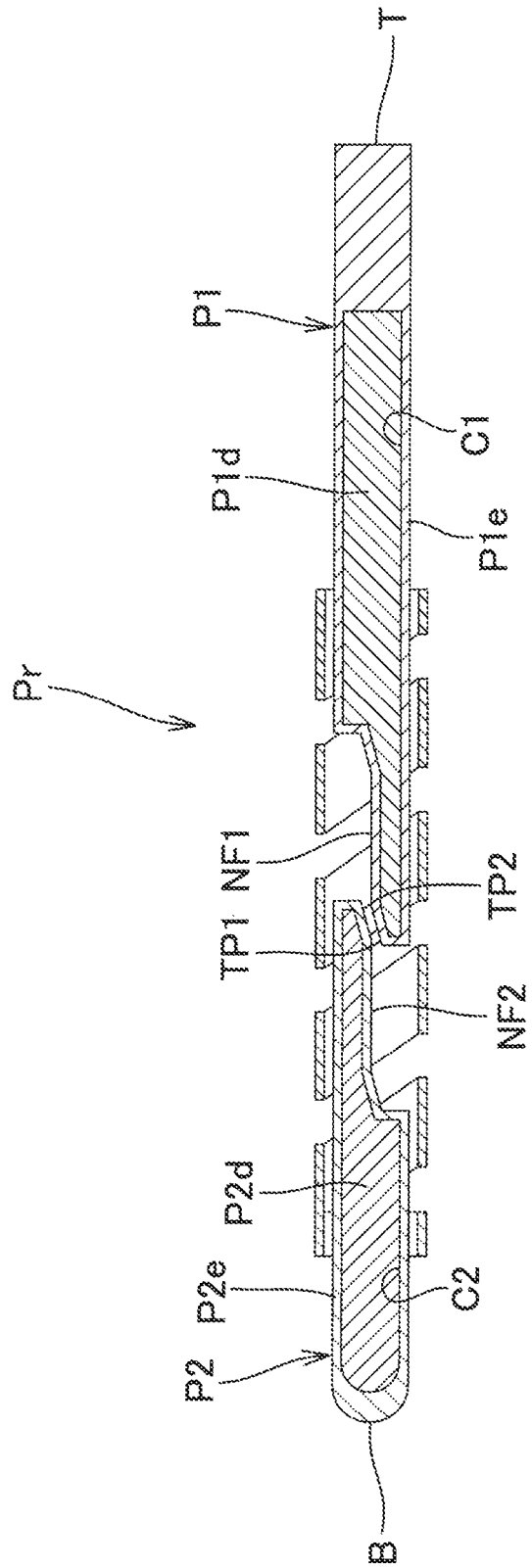
FIG. 7 is a cross-sectional view illustrating a cross section taken along line VII-VII of the contact Pr illustrated in FIG. 3.

Referring to FIG. 7, first and second inner conductors P1d and P2d made from a material having conductivity higher than that of a material constituting an outer shell are embedded in the first and second conductors P1 and P2. An outer portion of the first conductor P1 enclosing the first inner conductor P1d corresponds to a first outer conductor P1e. An outer portion of the second conductor P2 enclosing the second inner conductor P2d corresponds to a second outer conductor P2e.

The first inner conductor P1d is located closer to the center than the first outer conductor P1e as viewed in the axial direction of the cylindrical body F. The second inner conductor P2d is located closer to the center than the second outer conductor P2e as viewed in the axial direction of the cylindrical body F.

Resistance values of the first and second inner conductors P1d and P2d are lower than resistance values of the first and second outer conductors P1e and P2e. In a case where Ni or the like is used as the first and second outer conductors P1e and P2e, for example, copper can be used as the first and second inner conductors P1d and P2d. In this manner, an electrical resistance of the contact Pr can be reduced.

Next, a method of manufacturing the contact Pr according to an example of the present disclosure will be described. As a method of manufacturing the contact Pr, various manufacturing techniques such as micro electro mechanical systems (MEMS) including exposure, plating, polishing, and the like, a semiconductor manufacturing process, electroforming, and three-dimensional molding by a 3D printer can be used.

Figure 8:
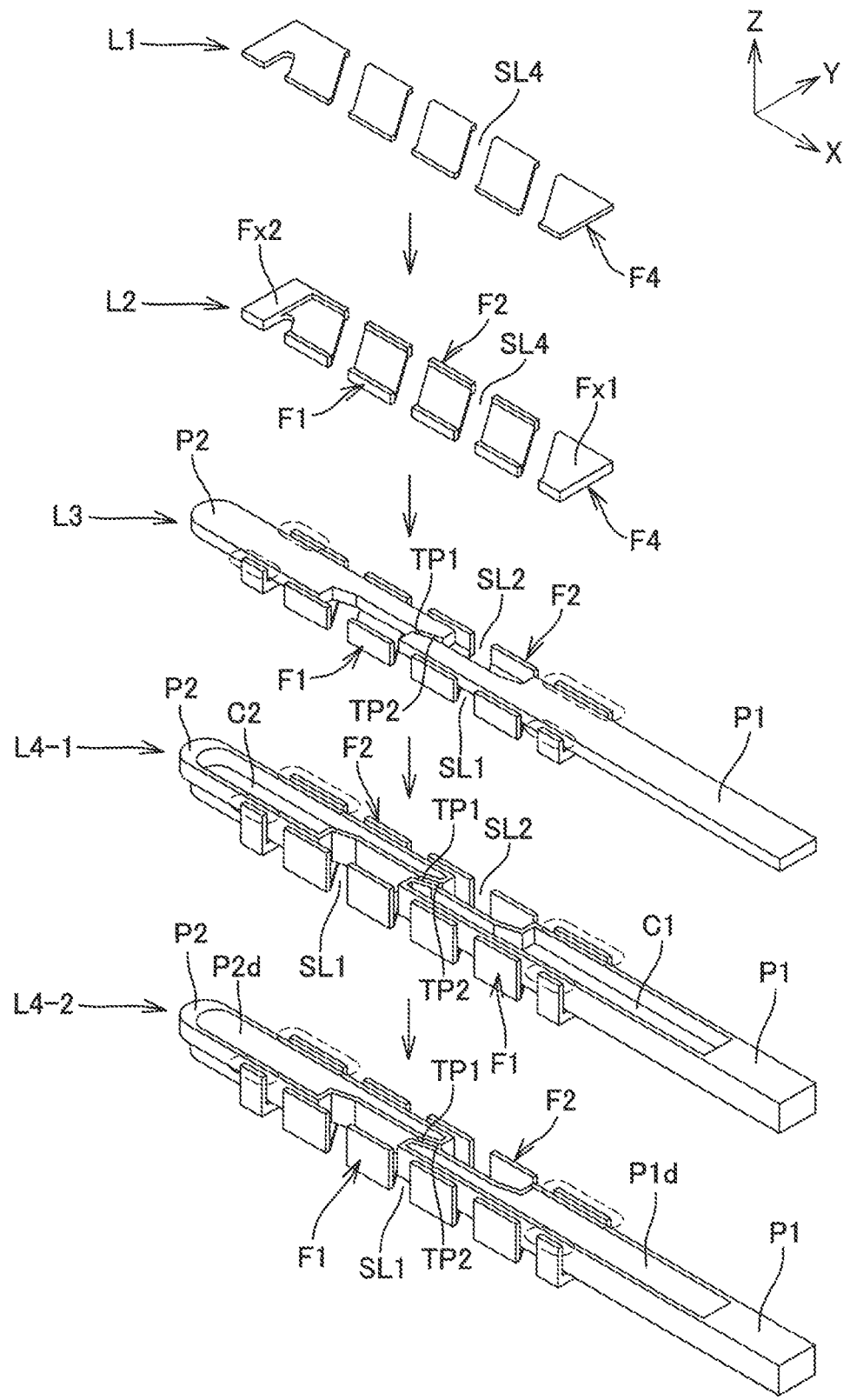
FIG. 8 is an explanatory diagram for explaining an example of a method of manufacturing the contact Pr shown in FIG. 3.

Referring to FIG. 8, first, Ni or the like is deposited horizontally along the X direction by electroforming or the like to the thickness t3, and a plurality of the fourth slits SL4 are formed by etching, for example. In this manner, the bottom wall portion F4 is horizontally formed as a first layer L1.

Next, Ni or the like is laminated on both end portions in the X direction of the bottom wall portion F4 and both end portions in the Y direction of the bottom wall portion F4 on the first layer L1 to the thicknesses t1 and t2. In this manner, a part of the first side wall portion F1 and the second side wall portion F2 and the fixing portions Fx1 and Fx2 are formed as a second layer L2.

Next, Ni or the like is laminated on the second layer L2 to form a part of the first conductor P1 and the second conductor P2, and the first side wall portion F1 and the second side wall portion F2 are grown in the Z direction. In this manner, a third layer L3 is formed. The first conductor P1 and the second conductor P2 are integrally formed as the fixing region P1c and the fixing region P2c are connected in a state of being fixed to the fixing portions Fx1 and Fx2.

Next, Ni or the like is laminated on the third layer L3, and the first conductor P1 and the second conductor P2, and the first side wall portion F1 and the second side wall portion F2 are grown in the Z direction. In this manner, a fourth layer L4-1 is formed. In the fourth layer L4-1, outer edges of the first conductor P1 and the second conductor P2 are raised, and cavities C1 and C2 are formed inside the first conductor P1 and the second conductor P2.

Next, as a fourth layer L4-2, the cavities C1 and C2 are filled with a material having a conductivity higher than that of Ni or the like, such as copper. In this manner, the first and second inner conductors P1d and P2d are formed. The first and second inner conductors P1d and P2d may be, for example, copper used as a sacrificial layer remaining in the cavities C1 and C2.

Figure 9:
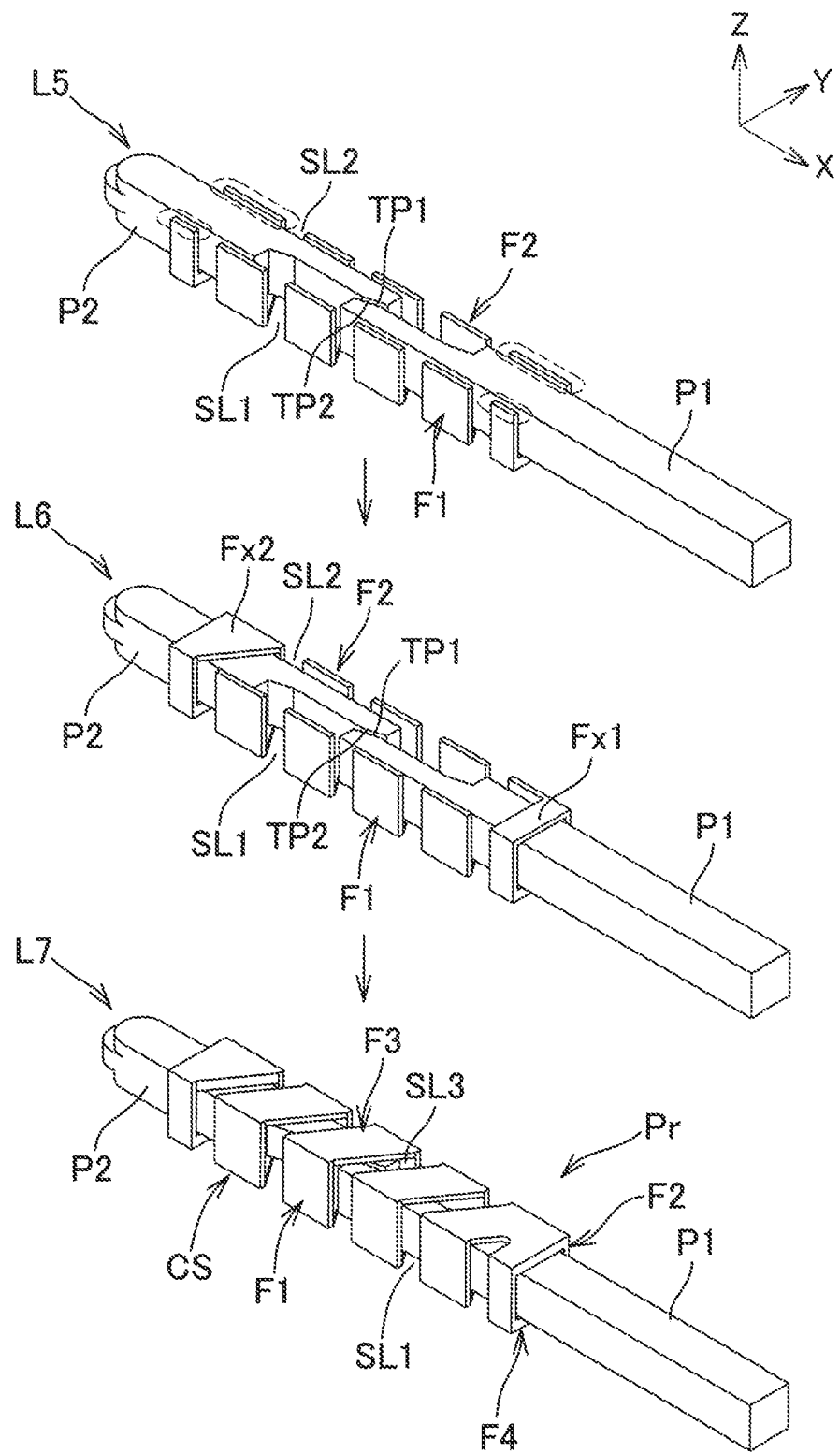
FIG. 9 is an explanatory diagram for explaining an example of the method of manufacturing the contact Pr shown in FIG. 3.

Next, referring to FIG. 9, Ni or the like is laminated on the fourth layer L4-2 to form the first conductor P1 and the second conductor P2. The first side wall portion F1 and the second side wall portion F2 are grown in the Z direction. In this manner, a fifth layer L5 is formed.

Next, Ni or the like is laminated on the fifth layer L5 to form the fixing portion Fx1 on the fixing region P1c of the first conductor P1, and form the fixing portion Fx2 on the fixing region P2c of the second conductor P2. The first side wall portion F1 and the second side wall portion F2 are grown in the Z direction. In this manner, a sixth layer L6 is formed. Also in the sixth layer L6, the first conductor P1 and the second conductor P2 are integrally formed as the fixing region P1c and the fixing region P2c are connected in a state of being fixed to the fixing portions Fx1 and Fx2.

Next, Ni or the like is laminated on the sixth layer L6 to form the top wall portion F3. In this manner, a seventh layer L7 is formed. In this manner, the contact Pr is completed.

According to the configuration of the contact Pr, by laminating the first layer L1 to the seventh layer L7, it is easy to manufacture the contact Pr in a state where the first portion P1b and the second portion P2b are inserted into the coil spring CS in advance. Therefore, unlike the conventional probe, the contact Pr does not require manual insertion of a columnar guide into a tubular body of a minute coil spring. As a result, the contact Pr is easier to manufacture than the conventional probe.

Further, according to the above manufacturing method, by laminating the first layer L1 to the seventh layer L7, a material such as copper or Ni is laminated in the vertical direction on the bottom wall portion F4 formed horizontally, and the contact Pr is manufactured. In this case, the direction in which the first slit SL1 and the second slit SL2 extend coincides with the laminating direction. As a result, outer edges of the first slit SL1 and the second slit SL2 become smooth, and strength of the coil spring CS is improved.

Figure 10:
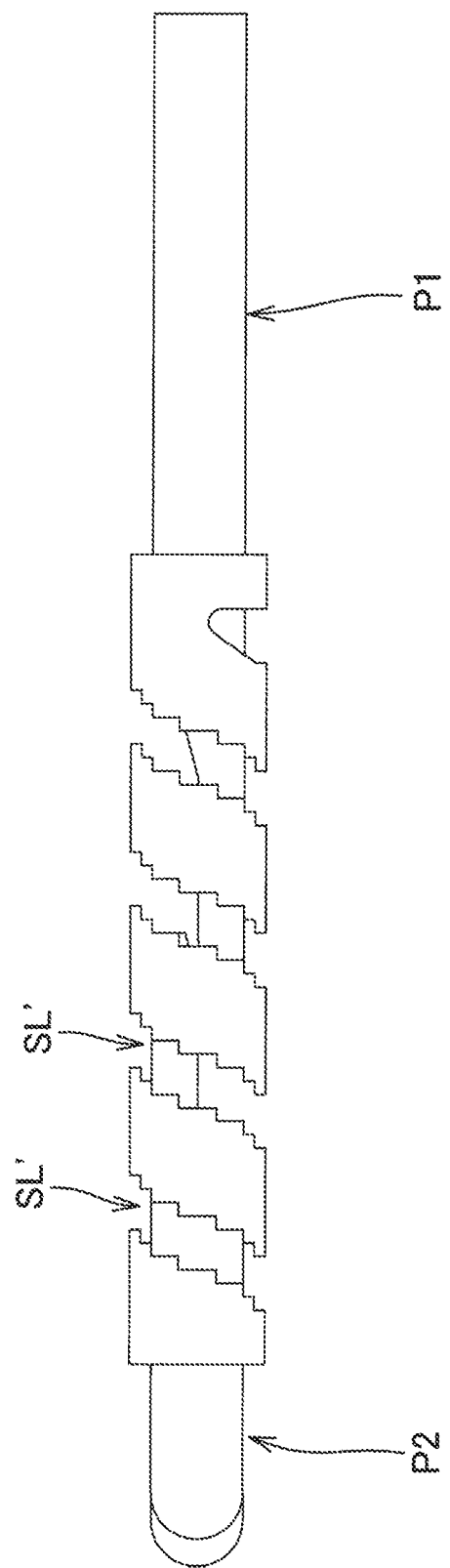
FIG. 10 is an explanatory view illustrating a case where a first slit SL1 and a second slit SL2 are assumed to be inclined.

Specifically, in a case where the first slit SL1 and the second slit SL2 are inclined, a step is formed for each layer of the first layer L1 to the seventh layer L7 as a slit SL' illustrated in FIG. 10. For this reason, a jagged shape is formed like the slit SL'. When the jagged shape is formed in this manner, a width of a spring portion becomes non-uniform, and a minimum width of the spring portion becomes smaller than that in a case where an outer edge of the slit is smooth. Further, a force applied to the spring portion becomes non-uniform. As a result, strength of the coil spring CS decreases.

That is, since the coil spring CS includes the first slit SL1 formed in the first side wall portion F1 and extending perpendicularly to the axial direction and the second slit SL2 formed in the second side wall portion F2 and extending perpendicularly to the axial direction, it is possible to easily manufacture the contact Pr while suppressing a decrease in the strength of the coil spring CS.

Further, in the process of laminating the third layer L3 to the fifth layer L5, the first tapered portion TP1 and the second tapered portion TP2 grow in the vertical direction along a plane direction of the first tapered portion TP1 and the second tapered portion TP2. Therefore, for the same reason as the first slit SL1 and the second slit SL2, the first tapered portion TP1 and the second tapered portion TP2 are smoothly formed without being jagged.

As a result, the first tapered portion TP1 and the second tapered portion TP2 can smoothly slide on each other to guide the first contact surface NF1 and the second contact surface NF2 to slide.

In the contact Pr, a plane direction in which the first tapered portion TP1 and the second tapered portion TP2 extend is along the Z direction, and is along a direction in which the first slit SL1 and the second slit SL2 extend. As a result, by horizontally forming the bottom wall portion F4 as the first layer L1 and laminating the second layer L2 to the seventh layer L7 on the first layer L1, the first slit SL1 and the second slit SL2 having smooth outer edges and the first tapered portion TP1 and the second tapered portion TP2 which are smooth and flat can be simultaneously formed.

Further, since a cross-sectional shape perpendicular to the axial direction of the first conductor P1, the second conductor P2, and the coil spring CS is substantially rectangular, wall surfaces of the first conductor P1, the second conductor P2, and the coil spring CS can be smoothly formed in the process of laminating the first layer L1 to the seventh layer L7 as compared with a case where the cross-sectional shape is circular.

Further, in a case of a structure in which, when a load is not applied to the coil spring CS, the first tapered portion TP1 and the second tapered portion TP2 or the first contact surface NF1 and the second contact surface NF2 are in contact with each other, the first conductor P1 and the second conductor P2 are not separated and become a single member when the third layer L3 to the fifth layer L5 are laminated.

However, in the contact Pr, when no load is applied to the coil spring CS, the first tapered portion TP1 and the second tapered portion TP2 are arranged to face each other while being separated from each other, and the first contact surface NF1 and the second contact surface NF2 are separated from each other. As a result, when the third layer L3 to the fifth layer L5 are laminated, the first conductor P1 and the second conductor P2 can be manufactured as separate members separated from each other.

Note that the contact Pr does not need to include the fixing portions Fx1 and Fx2, and does not need to have the second layer L2 and the sixth layer L6 formed. Further, in the third layer L3 to the fifth layer L5, the first side wall portion F1 and the second side wall portion F2 in the vicinity of both end portions of the coil spring CS (portion surrounded by a broken line in FIGS. 8 and 9) may be connected to the first conductor P1 and the second conductor P2.

Referring to FIG. 2, in a state before the inspection jig 3 is attached to the pitch conversion block 35, the second conductor P2 slightly protrudes from the support plate 312. Then, as illustrated in FIG. 11, when the support plate 312 is attached to the pitch conversion block 35, the upper end of the second conductor P2, that is, the proximal end portion B of the contact Pr is pressed against the electrode 34a of the pitch conversion block 35.

As a result, the coil spring CS of the contact Pr is compressed and elastically deformed. The second conductor P2 is pushed into the support member 31 against a biasing force of the coil spring CS. Then, a distal end of the second conductor P2, that is, the proximal end portion B is brought into pressure contact with the electrode 34a according to the biasing force of the coil spring CS. As a result, the proximal end portion B of the contact Pr and the electrode 34a are held in a stable conductive contact state.

In this state, as illustrated in FIG. 11, the first contact surface NF1 of the first conductor P1 and the second contact surface NF2 of the second conductor P2 are in contact with each other. Even in a state where the bump BP is not in contact with the contact Pr, the first contact surface NF1 and the second contact surface NF2 are kept in a contact state, so that a resistance value of the contact Pr from the distal end portion T to the proximal end portion B is stably kept at a low resistance.

However, in a state where the bump BP is not in contact with the contact Pr, the first contact surface NF1 and the second contact surface NF2 are not necessarily in contact with each other.

Figure 12:
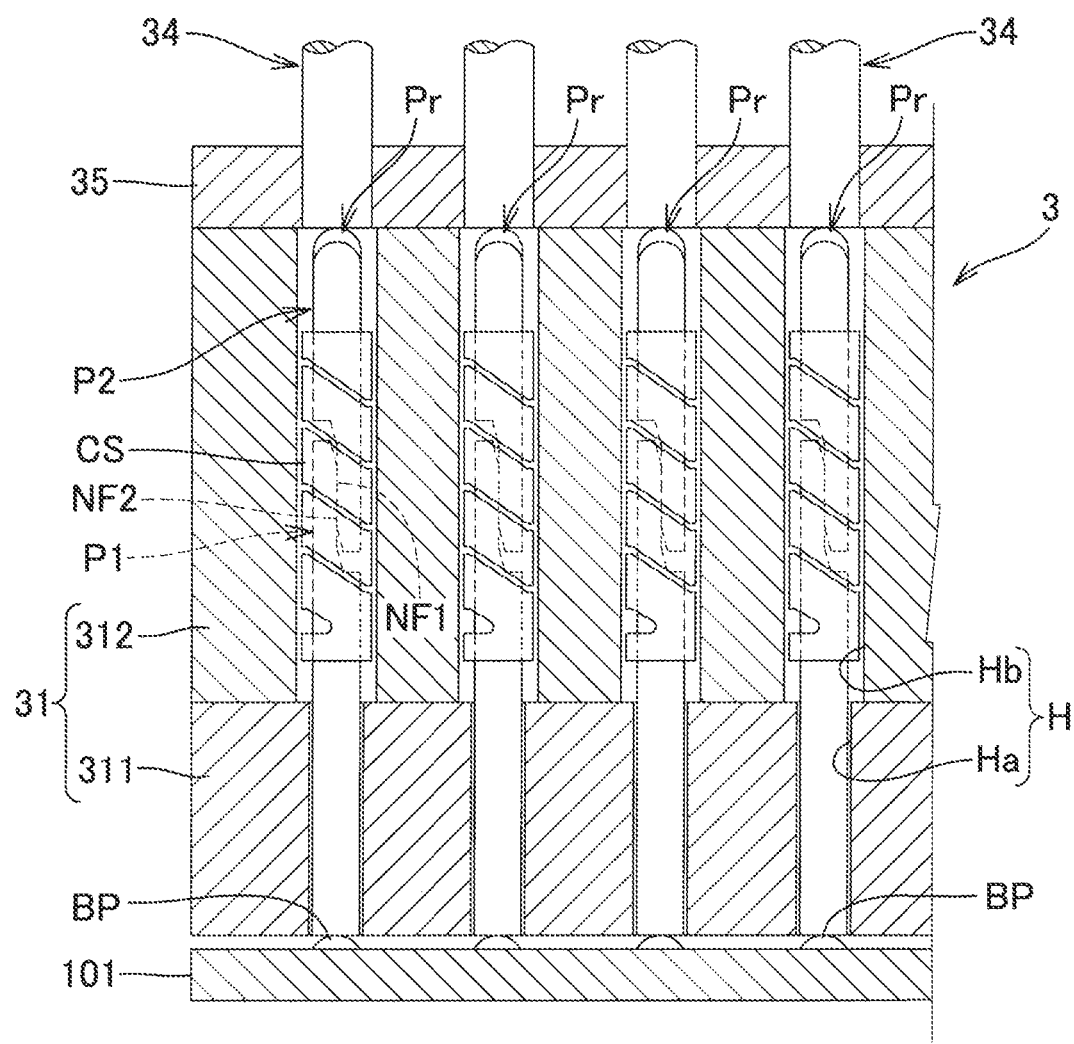
FIG. 12 is a schematic cross-sectional view illustrating an inspection state in which the contact Pr illustrated in FIG. 2 is pressed against a bump BP.

As illustrated in FIG. 12, when the inspection jig 3 is brought into pressure contact with the semiconductor wafer 101, the distal end portion T of the contact Pr is pressed against the bump BP of the semiconductor wafer 101.

As a result, the coil spring CS of the contact Pr is further compressed and elastically deformed. The first conductor P1 is pushed into the support member 31 against a biasing force of the coil spring CS. Then, the distal end of the first conductor P1, that is, the distal end portion T is pressed against the bump BP according to the biasing force of the coil spring CS. As a result, the distal end portion T of the contact Pr and the bump BP are held in a stable conductive contact state.

In this state, as illustrated in FIG. 12, the first contact surface NF1 of the first conductor P1 and the second contact surface NF2 of the second conductor P2 come into contact with each other. In this manner, a resistance value of the contact Pr from the distal end portion T to the proximal end portion B can be a low resistance at the time of inspection.

Note that a cross-sectional shape perpendicular to the axial direction of the first conductor P1 and the second conductor P2 is not necessarily limited to a rectangular shape, and may be a substantially circular shape. Further, a plane direction in which the first contact surface NF1 and the second contact surface NF2 extend does not necessarily coincide with a direction in which the first slit SL1 and the second slit SL2 extend.

Further, the first tapered portion TP1 and the second tapered portion TP2 are not necessarily formed at a distal end of the first conductor P1 and the second conductor P2. Further, the first contact surface NF1 and the second contact surface NF2 only need to be in contact with each other at the time of inspection, and are not necessarily located in the same plane.

Further, the contact Pr does not need to include the second conductor P2. The first conductor P1 does not need to have the first notch portion N1 formed.

That is, the contact according to an example of the present disclosure includes a coil spring in which a slit is formed in a cylindrical body, a first conductor having a substantially rod-like shape, and a second conductor having a substantially rod-like shape. The cylindrical body includes a bottom wall portion, a first side wall portion and a second side wall portion connected to the bottom wall portion, and a top wall portion facing the bottom wall portion, the bottom wall portion, the first side wall portion, the second side wall portion, and the top wall portion are configured such that a cross-sectional shape of the cylindrical body as viewed in an axial direction is rectangular, the slit includes a first slit provided in the first side wall portion, a second slit provided in the second side wall portion, a third slit provided in the top wall portion, and a fourth slit provided in the bottom wall portion, the third slit is continuous with the first slit and the second slit, the fourth slit is continuous with the second slit, the first slit and the second slit have a rectangular shape in a side view of the cylindrical body, the first conductor is connected to a first end portion of the cylindrical body, and the second conductor is connected to a second end portion of the cylindrical body.

According to this configuration, in the coil spring, the first slit, the third slit, the second slit, and the fourth slit communicate with each other to form a spiral slit along a peripheral wall of the cylindrical body. The spiral slit forms the coil spring having a rectangular cross-sectional shape perpendicular to the axial direction. The first conductor having a substantially rod-like shape is connected to one end of the coil spring. In the contact having such a shape, a material is laminated on the bottom wall portion with the axial direction of the contact being horizontal, so that the first slit and the second slit can be formed in the vertical direction along a lamination direction. The shape extending along the lamination direction can be formed smoothly. Then, it is easy to integrally manufacture the coil spring and the first conductor by lamination. Therefore, since work of manually inserting the contact into the coil spring as in the conventional probe is unnecessary, such a contact is easy to manufacture.

Further, the first conductor includes a first portion located inside the cylindrical body, a first protruding portion protruding from the first end portion of the cylindrical body, the second conductor includes a second portion located inside the cylindrical body, and a second protruding portion protruding from the second end portion of the cylindrical body, the first portion includes a first contact surface extending along an axial direction of the cylindrical body, the second portion includes a second contact surface located on a same plane as the first contact surface, and the first contact surface and the second contact surface are separated from each other in a case where no load is applied to the coil spring, and the first contact surface and the second contact surface are in contact with each other in a case where a load is applied to the coil spring.

According to this configuration, since the first contact surface and the second contact surface are separated from each other when no load is applied to the coil spring, it is easy to manufacture the first conductor and the second conductor as separate members in a case of manufacturing the contact by laminating a material. Further, since the first contact surface and the second contact surface come into contact with each other when a predetermined load is applied to the coil spring, the first conductor and the second conductor are conductive in surface contact. As a result, a resistance value of the contact from the first conductor to the second conductor is reduced at the time of inspection in which a load is applied to the contact.

A plane direction of the first contact surface can be orthogonal to a plane direction of the bottom wall portion.

According to this configuration, a plane direction in which the first and second contact surfaces extend and a direction in which the first and second slits extend can both coincide with a lamination direction. As a result, in a case where the contact is manufactured by lamination, it is easy to smoothly form the first and second contact surfaces together with the shapes of the first and second slits.

Further, the configuration can be such that a first tapered portion is formed in the first portion, a second tapered portion is formed in the second portion, the first tapered portion is configured to decrease in thickness toward a distal end of the first portion, and the second tapered portion is configured to decrease in thickness toward a distal end of the second portion.

According to this configuration, when a load is applied to the contact and the coil spring is compressed, the first tapered portion and the second tapered portion can be guided to cause the first contact surface and the second contact surface to slide by inclination of the first tapered portion and the second tapered portion.

Further, a cross-sectional shape of the first portion as viewed in the axial direction of the cylindrical body can be rectangular.

According to this configuration, it is easy to configure the contact to have low resistance by making a conductor area of a cross section perpendicular to the axial direction of the first portion larger than a circular shape. Further, when the contact is manufactured by lamination, it is easy to smoothly form an outer peripheral surface of the first portion.

Further, the configuration can be such that the first conductor includes a first inner conductor and a first outer conductor, the first inner conductor has a portion located closer to a center side than the first outer conductor as viewed in the axial direction of the cylindrical body, and a resistance value of the first inner conductor is lower than a resistance value of the first outer conductor.

According to this configuration, since the first conductor includes the first inner conductor having lower resistance than the first outer conductor, it is easy to reduce a resistance value of the first conductor.

Further, an inspection jig according to an example of the present disclosure includes the contact described above and a support member that supports the contact.

According to this configuration, since the inspection jig is configured using the contact that is easy to manufacture, it is easy to manufacture the inspection jig.

Further, an inspection device according to an example of the present disclosure includes the inspection jig described above and an inspection processing unit that performs an inspection of an inspection target on the basis of an electric signal obtained as the contact is brought into contact with an inspection point provided on the inspection target.

According to this configuration, since the inspection device is configured using the contact that is easy to manufacture, it is easy to manufacture the inspection device.

A method of manufacturing a contact according to an example of the present disclosure is a method of manufacturing the contact described above, in which the first side wall portion and the second side wall portion are formed after the bottom wall portion is formed.

According to this method, the above-described contact can be easily manufactured.

Features of the above-described various embodiments and the modifications thereof may be combined appropriately as long as no conflict arises.

While various embodiments of the present disclosure have been described above, it is to be understood that variations and modifications will be apparent to those skilled in the art without departing from the scope and spirit of the present disclosure. Accordingly, it is intended by the appended claims to cover all modifications of the present disclosure that fall within the true spirit and scope of the present disclosure or invention.

What is claimed is:

1. A contact comprising:
a coil spring in which a slit is formed in a cylindrical body;
a first conductor having a substantially rod-like shape; and
a second conductor having a substantially rod-like shape, wherein
the cylindrical body includes a bottom wall portion, a first side wall portion and a second side wall portion connected to the bottom wall portion, and a top wall portion facing the bottom wall portion,
the bottom wall portion, the first side wall portion, the second side wall portion, and the top wall portion are configured such that a cross-sectional shape of the cylindrical body as viewed in an axial direction is rectangular, the slit includes a first slit provided in the first side wall portion, a second slit provided in the second side wall portion, a third slit provided in the top wall portion, and a fourth slit provided in the bottom wall portion, the third slit is continuous with the first slit and the second slit, the fourth slit is continuous with the second slit, the first conductor is connected to a first end portion of the cylindrical body, the second conductor is connected to a second end portion of the cylindrical body, the first slit and the second slit each extends perpendicular to the axial direction, and the third slit and the fourth slit each extends at an inclined angle with respect to the axial direction.

2. The contact according to claim 1, wherein the first conductor includes:

a first portion located inside the cylindrical body; and a first protruding portion protruding from the first end portion of the cylindrical body, the second conductor includes:

a second portion located inside the cylindrical body; and a second protruding portion protruding from the second end portion of the cylindrical body, the first portion includes a first contact surface extending along an axial direction of the cylindrical body, the second portion includes a second contact surface located on a same plane as the first contact surface, and the first contact surface and the second contact surface are separated from each other in a case where no load is applied to the coil spring, and the first contact surface and the second contact surface are in contact with each other in a case where a load is applied to the coil spring.

3. The contact according to claim 2, wherein a plane direction of the first contact surface is orthogonal to a plane direction of the bottom wall portion.

4. The contact according to claim 3, wherein a first tapered portion is formed in the first portion, a second tapered portion is formed in the second portion, the first tapered portion is configured to decrease in thickness toward a distal end of the first portion, and the second tapered portion is configured to decrease in thickness toward a distal end of the second portion.

5. The contact according to claim 3, wherein a cross-sectional shape of the first portion as viewed in the axial direction of the cylindrical body is rectangular.

6. The contact according to claim 3, wherein the first conductor includes a first inner conductor and a first outer conductor, the first inner conductor has a portion located closer to a center side than the first outer conductor as viewed in the axial direction of the cylindrical body, and a resistance value of the first inner conductor is lower than a resistance value of the first outer conductor.

7. An inspection jig comprising:

the contact according to claim 3; and a support member that supports the contact.

8. The contact according to claim 2, wherein a first tapered portion is formed in the first portion, a second tapered portion is formed in the second portion, the first tapered portion is configured to decrease in thickness toward a distal end of the first portion, and the second tapered portion is configured to decrease in thickness toward a distal end of the second portion.

9. The contact according to claim 8, wherein a cross-sectional shape of the first portion as viewed in the axial direction of the cylindrical body is rectangular.

10. The contact according to claim 8, wherein the first conductor includes a first inner conductor and a first outer conductor, the first inner conductor has a portion located closer to a center side than the first outer conductor as viewed in the axial direction of the cylindrical body, and a resistance value of the first inner conductor is lower than a resistance value of the first outer conductor.

11. An inspection jig comprising:

the contact according to claim 8; and a support member that supports the contact.

12. The contact according to claim 2, wherein a cross-sectional shape of the first portion as viewed in the axial direction of the cylindrical body is rectangular.

13. The contact according to claim 2, wherein the first conductor includes a first inner conductor and a first outer conductor, the first inner conductor has a portion located closer to a center side than the first outer conductor as viewed in the axial direction of the cylindrical body, and a resistance value of the first inner conductor is lower than a resistance value of the first outer conductor.

14. An inspection jig comprising:

the contact according to claim 2; and a support member that supports the contact.

15. The contact according to claim 1, wherein the first conductor includes a first inner conductor and a first outer conductor, the first inner conductor has a portion located closer to a center side than the first outer conductor as viewed in the axial direction of the cylindrical body, and a resistance value of the first inner conductor is lower than a resistance value of the first outer conductor.

16. An inspection jig comprising:

the contact according to claim 1; and a support member that supports the contact.

17. An inspection device comprising:

the inspection jig according to claim 16; and an inspection processing unit that performs an inspection of an inspection target based on an electric signal obtained as the contact is brought into contact with an inspection point provided on the inspection target.

18. A method of manufacturing the contact according to claim 1, wherein the first side wall portion and the second side wall portion are formed after the bottom wall portion is formed.

19. The contact according to claim 12, wherein the first conductor includes a first inner conductor and a first outer conductor, the first inner conductor has a portion located closer to a center side than the first outer conductor as viewed in the axial direction of the cylindrical body, and a resistance value of the first inner conductor is lower than a resistance value of the first outer conductor.

* * * * *